United States Patent
Fu

(12) 
(10) Patent No.: US 7,452,639 B2
(45) Date of Patent: Nov. 18, 2008

(54) PHOTOMASK WITH PHOTORESIST TEST PATTERNS AND PATTERN INSPECTION METHOD

(75) Inventor: Kuo-Kuei Fu, Shanghai (CN)

(73) Assignee: Grace Semiconductor Manufacturing Corporation, Shanghai (CN)

( * ) Notice: Subject to any disclaimer, the term of this patent is extended or adjusted under 35 U.S.C. 154(b) by 693 days.

(21) Appl. No.: 10/972,457

(22) Filed: Oct. 26, 2004

(65) Prior Publication Data

US 2005/0089769 A1    Apr. 28, 2005

(30) Foreign Application Priority Data

Oct. 27, 2003    (CN)    .................. 2003 1 0108190

(51) Int. Cl.
*G03F 9/00*    (2006.01)

(52) U.S. Cl. ................. 430/22; 430/5; 430/30

(58) Field of Classification Search .............. 430/5, 430/30, 22
See application file for complete search history.

(56) References Cited

U.S. PATENT DOCUMENTS 5,521,036 A * 5/1996 Iwamoto et al. ............... 430/22
5,798,193 A * 8/1998 Pierrat et al. .................... 430/5

* cited by examiner

*Primary Examiner*—Mark F. Huff
*Assistant Examiner*—Jonathan Jelsma
(74) *Attorney, Agent, or Firm*—Rosenberg, Klein & Lee

(57) ABSTRACT

A photomask with photoresist test patterns and pattern inspection method using four test patterns on the photomask to perform the exposure on the first photoresist layer in order to adjust the photomask. The present invention prevents misalignment of the first photomask. The information associated with the misalignment is provided to the process engineer based on the location of the test patterns.

14 Claims, 5 Drawing Sheets

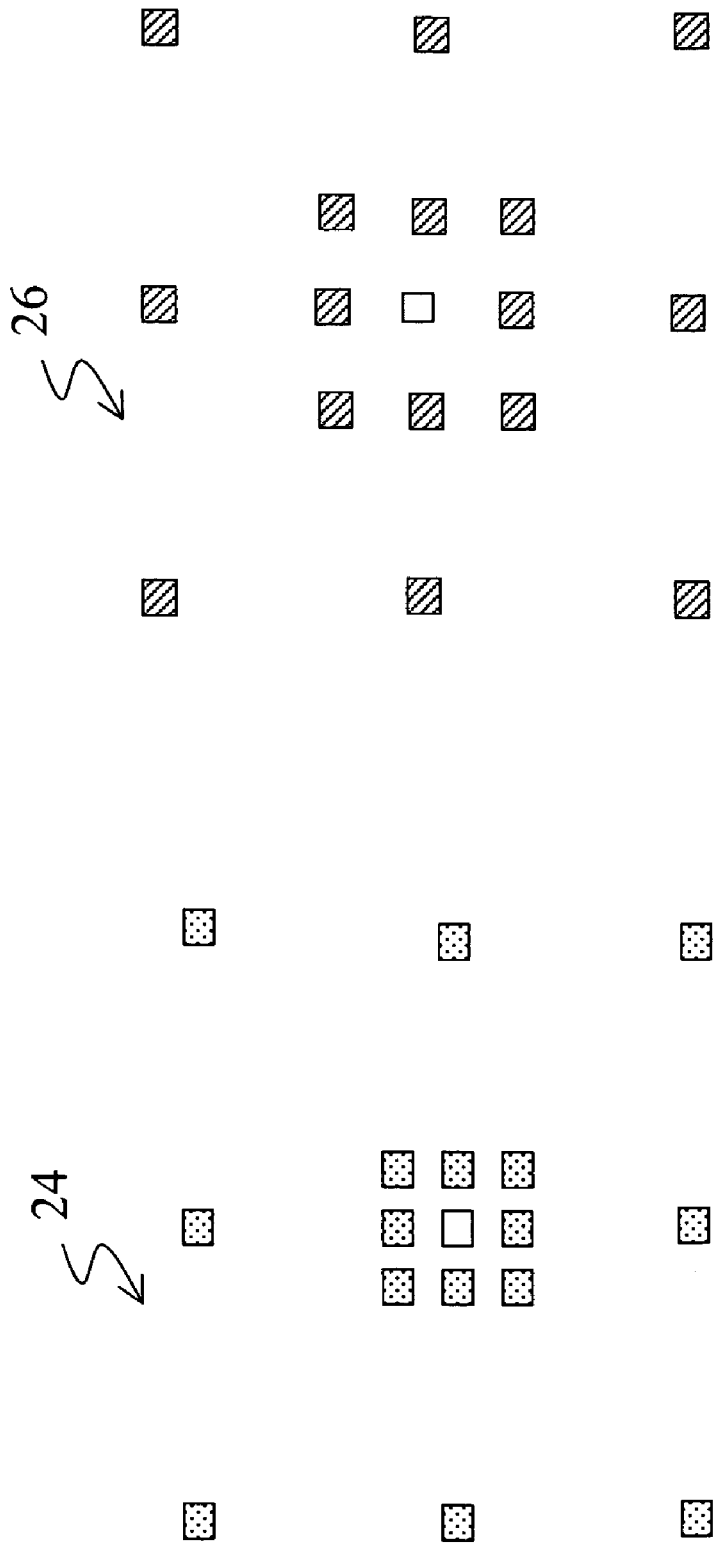

PHOTOMASK WITH PHOTORESIST TEST PATTERNS AND PATTERN INSPECTION METHOD

BACKGROUND OF THE INVENTION

1. Field of the Invention

The present invention relates to a photomask, and more particularly, to a photomask with photoresist test patterns and a pattern inspection method.

2. Description of the Prior Art

In the current lithography process, a stepper is used to perform photomask pattern transfer in order to obtain an image with high resolution and better particle tolerance. However, the main problem of this method is that a wafer needs to be exposed separately in order to complete the fabrication of a single patterned layer. Exposure needs to be performed several times in order to finish one single patterned layer. In order to ensure that the patterns between the layers are stacked accurately, layers of photoresist material can be inspected following development (after-develop-inspection or "ADI") to ensure that the pattern transfer process has been performed correctly and/or that the pattern is within specified tolerances. From such inspection, mistakes or unacceptable process variations associated with the layer of photoresist material can be identified and corrected. However, from this inspection, the patterned exposure status of the first layer can not be monitored, thereby resulting in mistakes associated with the patterned exposure of the first layer being undefectable. Further, it wastes processing time and increases cost.

In the view of this, the present invention provides a photomask with photoresist test patterns and a pattern inspection method, which eliminates misalignment errors of the first layer of photomask in step exposure to effectively overcome the problems that exist in the prior art.

SUMMARY OF THE INVENTION

The present invention provides a photomask with photoresist test patterns and a pattern inspection method for monitoring the patterned exposure status of the first layer.

The present invention also provides information associated with which the step causes misalignment for the process engineer.

Additionally, the present invention reduces the expense in processing due to mistakes in the first layer of patterned exposure.

To achieve the aforementioned objects, a preferred embodiment of the present invention provides a photomask with photoresist test pattern, comprising a layout pattern area and an external pattern area located surrounding the layout pattern area. The external pattern area comprises first/second/third/fourth alignment areas formed thereon. The arrangement of the test pattern uses the center of the first alignment pattern area as a coordinate axis (0,0) center. The points of the test pattern of the first alignment area are picked based on the coordinates (1+4a, 0), (−1−4b, 0), (0, 1+4c), (0, −1−4d), (1+4e, 1+4e), (−1−4f, −1−4f), (1+4g, −1−4g), and (−1−4h, 1+4h), wherein a, b, c, d, e, f, g, and h are natural numbers. The arrangement of the second test pattern uses the center of the second alignment pattern area as a coordinate axis (0,0) center. The points of the test pattern of the second alignment area are picked based on the coordinates (2+4i,0), (−2−4j,0), (0,2+4k), (0,−2−4l), (2+4m,2+4m), (−2−4n,−2−4n), (2+4p,−2−4p), and (−2−4q,2+4q), wherein i, j, k, l, m, n, p, and q are natural numbers. The arrangement of the third test pattern uses the center of the third alignment pattern area as a coordinate axis (0,0) center. The points of the test pattern of the third alignment area are picked based on the coordinates (3+4r,0), (−3−4s,0), (0,3+4t), (0,−3−4u), (3+4v,3+4v), (−3−4w,−3−4w), (3+4z,−3−4z), and (−3−4A,3+4A), wherein r, s, t, u, v, w, z, and A are natural numbers. The arrangement of the fourth test pattern uses the center of the fourth alignment pattern area as a coordinate axis (0,0) center. The points of the test pattern of the fourth alignment pattern area are picked based on the coordinates (4+4B,0), (−4−4C,0), (0,4+4D), (0,−4−4E), (4+4F,4+4F), (−4−4G,−4−4G), (4+4H,−4−4H), and (−4−4I, 4+4I), wherein B, C, D, E, F, G, H, and I are natural numbers.

Another embodiment of the present invention provides an inspection method of the photoresist test patterns, comprising the steps of: providing a silicon substrate having a photoresist layer formed thereon; performing a step exposure on the photoresist layer by using a photomask with a layout pattern area and an external pattern area, wherein the external pattern area is located surrounding the layout pattern area, and wherein the external pattern area comprises first/second/third/fourth alignment pattern areas; the test patterns of the first alignment pattern area are arranged by using a center of the first alignment pattern area as a coordinate axis (0,0), and the points of the test patterns of the first alignment area are picked based on the coordinates (1+4a, 0), (−1−4b, 0), (0, 1+4c), (0, −1−4d), (1+4e, 1+4e), (−1−4f, −1−4f), (1+4g, −1−4g), and (−1−4h, 1+4h), and wherein a, b, c, d, e, f, g, and h are natural numbers; the test patterns of the second alignment pattern area are arranged by using a center of the second alignment pattern area as a coordinate axis (0,0), and the points of the test patterns of the second alignment pattern area are picked based on the coordinates (2+4i,0), (−2−4j, 0), (0, 2+4k), (0,−2−4l), (2+4m, 2+4m), (−2−4n,−2−4n), (2+4p,−2−4p), and (−2−4q, 2+4q), and wherein i, j, k, l, m, n, p, and q are natural numbers; the test patterns of the third alignment pattern area are arranged by using a center of the third alignment pattern area as a coordinate axis (0,0), and the points of the test patterns of the third alignment pattern area are picked based on the coordinates (3+4r,0), (−3−4s,0), (0,3+4t), (0,−3−4u), (3+4v,3+4v), (−3−4w,−3−4w), (3+4z, −3−4z), and (−3−4A,3+4A), and wherein r, s, t, u, v, w, z and A are natural numbers; the test patterns of the fourth alignment pattern area are arranged by using a center of the fourth alignment pattern area as a coordinate axis (0,0), and the points of the test patterns of the fourth alignment pattern area are picked based on the coordinates (4+4B,0), (−4−4C, 0), (0,4+4D), (0,−4−4E), (4+4F,1+4F), (−4−4G,−4−4G), (4+4H,−4−4H), and (−4−4I,4+4I), and wherein B, C, D, E, F, G, H and I are Natural numbers; and developing the photoresist layer to form a layout pattern and a photoresist test pattern in order to form the test patterns for monitoring the patterned exposure status of the first layer in completing step exposure.

These and other objectives of the present invention will become obvious to those of ordinary skill in the art after reading the following detailed description of the preferred embodiment.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIGS. 2a to 2d illustrate the first/second/third/fourth alignment patterns in accordance with an embodiment of the present invention;

DETAILED DESCRIPTION OF THE PREFERRED EMBODIMENTS

The present invention uses different test patterns having four alignment pattern areas on the external pattern area of the photoresist to detect stacking faults in the exposure process.

Figure 1:
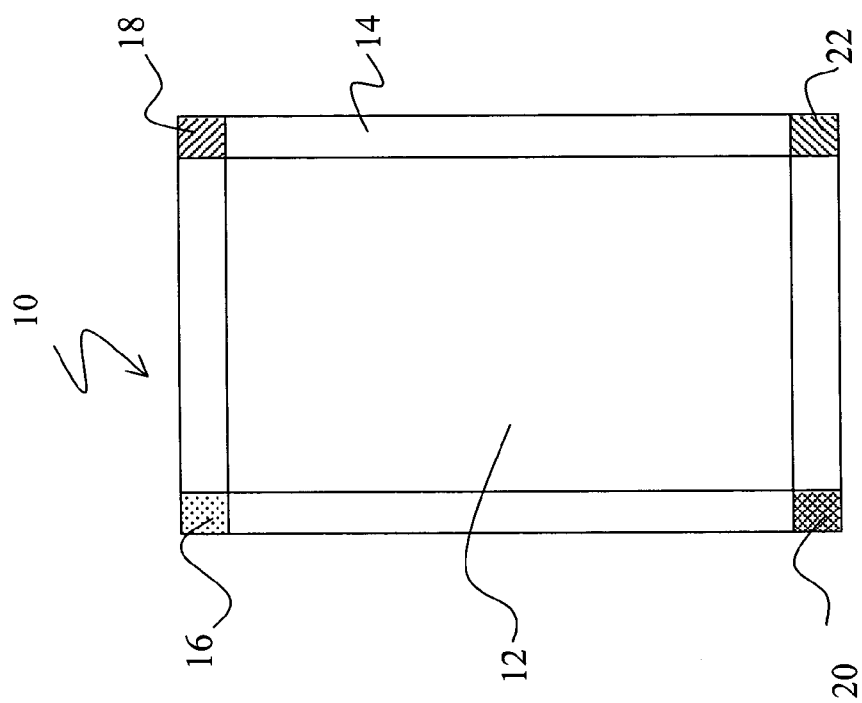
FIG. 1 is a photomask profile diagram in accordance with an embodiment of the present invention, showing the relative location of the layout pattern areas, the external pattern areas, and the first/second/third/fourth alignment pattern areas.

The present invention relates to a photomask 10 with photoresist test patterns, as shown in FIG. 1. The photomask 10 mainly comprises the layout pattern area 12 located in the center of the photomask 10, and external pattern areas 14 located surrounding the layout pattern area 12. The external pattern areas 14 comprise a first alignment pattern area 16, a second alignment pattern area 18, a third alignment pattern 20, and a fourth alignment pattern area 22. The first alignment pattern area 16 is represented by the dotted area in FIG. 1. The test pattern of the first alignment pattern area 16 forms a first test pattern 24 as shown in FIG. 2a. In order for easy recognition, the first test pattern 24 and first alignment pattern area 16 are represented by the same dots, and other test patterns and alignment pattern areas are represented in a similar way. The arrangement of the first test pattern 24 uses the first alignment pattern area 16 as a coordinate axis (0,0) center. The point of the test pattern is picked based on the coordinates (1+4a, 0), (−1−4b, 0), (0, 1+4c), (0, −1−4d), (1+4e, 1+4e), (−1−4f, −1−4f), (1+4g, −1−4g), and (−1−4h, 1+4h), wherein a, b, c, d, e, f, g, and h are natural numbers. If a=b=c=d=e=f=g=h=0, the points of the test patterns are (0,0), (1,0), (−1,0), (0, 1), (0, −1), (1, 1), (−1, −1), (1, −1), and (−1, 1).

The second alignment pattern area 18 forms a second test pattern 26 as shown in FIG. 2b. The arrangement of the second test pattern 26 uses the second alignment pattern area 18 as a coordinate axis (0,0) center. The point of the test pattern is picked based on the coordinates (2+4i,0), (−2−4j,0), (0,2+4k), (0,−2−4l), (2+4m,2+4m), (−2−4n,−2−4n), (2+4p,−2−4p), and (−2−4q,2+4q), wherein i, j, k, l, m, n, p, and q are natural numbers. If i=j=k=l=m=n=p=q=0, the points of test patterns are (2,0), (−2,0), (0,2), (0,−2), (2,2), (−2,−2), (2,−2), and (−2, 2).

Figures 2C, 2D:
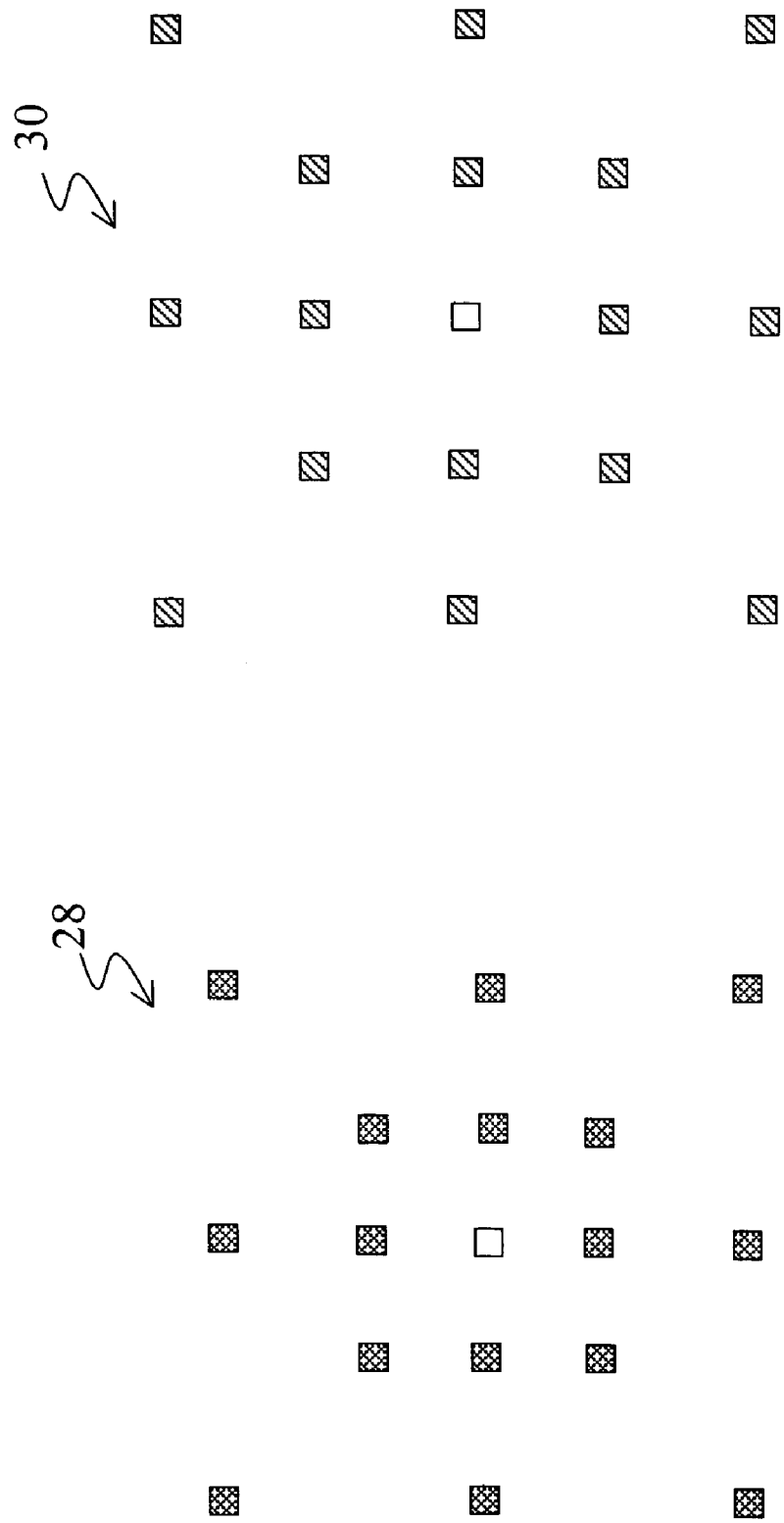

The third alignment pattern area 20 forms a third test pattern 28 as shown in FIG. 2c. The arrangement of the third test pattern 28 uses the third alignment pattern area 20 as a coordinate axis (0,0) center. The point of the test pattern is picked based on the coordinates (3+4r,0), (−3−4s,0), (0,3+4t), (0,−3−4u), (3+4v,3+4v), (−3−4w,−3−4w), (3+4z,−3−4z), and (−3−4A,3+4A), wherein r, s, t, u, v, w, z, and A are natural numbers. If r=s=t=u=v=w=z=A=0, the points of the test patterns are (3,0), (−3,0), (0, 3), (0, −3), (3, 3), (−3,−3), (3,−3), and (−3,3).

The fourth alignment pattern area 22 forms a fourth test pattern 30 as shown in FIG. 2d. The arrangement of the fourth test pattern 30 uses the fourth alignment pattern area 22 as a coordinate axis (0,0) center. The point of the test pattern is picked based on the coordinates (4+4B,0), (−4−4C,0), (0, 4+4D), (0,−4−4E), (4+4F,4+4F), (−4−4G,−4−4G), (4+4H,−4−4H), and (−4−4I, 4+4I), wherein B, C, D, E, F, G, H, and I are natural numbers. If B=C=D=E=F=G=H=I=0, the points of test patterns are (4,0), (−4,0), (0, 4), (0,−4), (4,4), (−4,−4), (4,−4), and (−4, 4).

Figure 3B:
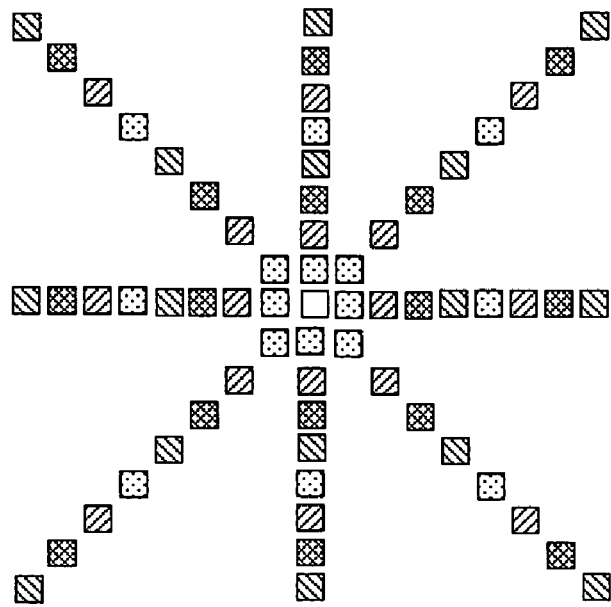
FIGS. 3a and 3b illustrate that the first/second/third/fourth alignment pattern areas of the photomask are stacked to present the optimum alignment patterns of the first/second/third/fourth test patterns in accordance with an embodiment of the present invention under the optimum exposure status.
Figure 3A:
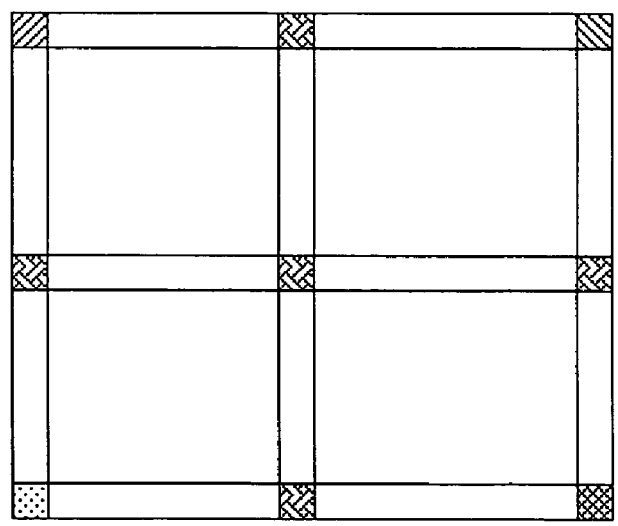

Refer to FIG. 3a and FIG. 3b, which is an illustration of a preferred embodiment of the present invention showing the photoresist test patterns, comprising the following steps:

First, a silicon substrate, having a photoresist layer coated on the surface of the silicon substrate, is provided. Then, step exposure is performed by using the photomask. In step exposure, the test pattern for performing the exposure is formed in the scribe line. The optimum exposure result is shown as FIG. 3a, wherein the external pattern areas 14 are stacked in the write line. The pattern coordinates of the first alignment pattern area 16, second alignment pattern area 18, third alignment pattern area 20, and fourth alignment pattern area 22 are overlapped to form the patterns based on the coordinates (0,0), (1,0), (−1,0),(0, 1), (0, −1), (1, 1), (−1, −1), (1, −1), (−1, 1), (2,0), (−2,0), (0, 2), (0, −2), (2, 2), (−2, −2), (2, 2), (−2, 2), (3,0), (−3,0), (0, 3), (0, −3), (3, 3), (−3,−3), (3,−3), (−3,3), (4,0), (−4,0), (0, 4), (0,−4), (4,4), (−4,−4), (4,−4), and (−4, 4), shown as the star-shaped alignment test pattern in FIG. 3b.

Figure 4B:
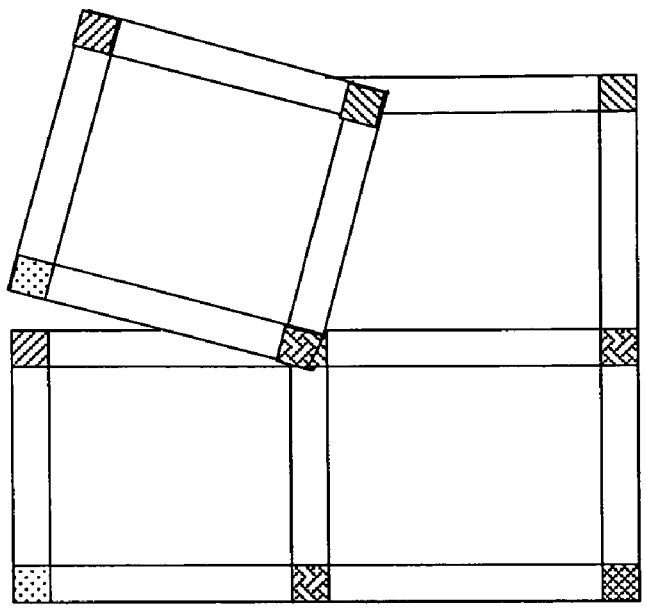
FIGS. 4a and 4b illustrate that the test patterns are presented in accordance with an embodiment of the present invention as applied under the photomask on the upper right area having stacking exposure status.
Figure 4A:
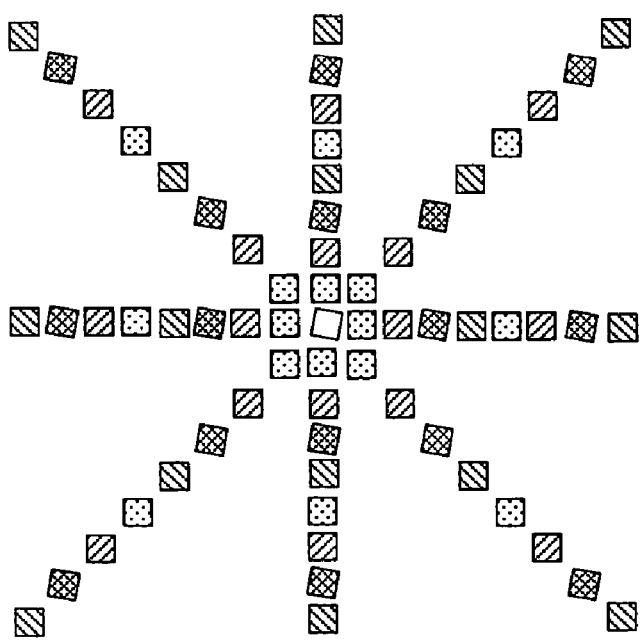

When the star-shaped alignment test pattern is formed as shown with test points (3,0), (−3,0), (0, 3), (0, −3), (3, 3), (−3,−3), (3,−3), and (−3,3) in FIG. 4a due to the stacking faults of the photomask. The third alignment pattern area provides the test points by inducing the coordinates of the test points. The stacking faults of the photomask on the upper right area are detected as shown in FIG. 4b.

In order to illustrate easily, the stacking portions of the alignment pattern areas are shown by the meshed patterns in FIG. 3a and FIG. 3b.

According to the present invention, a photomask with photoresist test patterns and pattern inspection method are provided. The test patterns are formed on the external pattern area of the photomask. After performing step exposure, the test patterns can be inspected using ADI to obtain the stacking faults of the photomask in the first photoresist layer, thereby preventing wasted expense. The stacking portions of the test patterns are detected, thereby identifying which step caused the misalignment.

The embodiment above is only intended to illustrate the present invention; it does not, however, to limit the present invention to the specific embodiment. Accordingly, various modifications and changes may be made without departing from the spirit and scope of the present invention as described in the following claims.

What is claimed is:

1. A photomask with photoresist test patterns, comprising:
   a layout pattern area; and
   an external pattern area located surrounding the layout pattern area, said external pattern area comprising:
   first, second, third and fourth alignment pattern areas formed at respective locations of said external pattern area, each of said first, second, third and fourth alignment pattern areas including respective test patterns, wherein said respective test patterns of said first, second, third and fourth alignment pattern areas are distinct each from the other;

wherein the test patterns of the first alignment pattern area are arranged by using a center of the first alignment pattern area as a coordinate axis (0, 0), and the points of the test patterns of the first alignment pattern area are picked based on the coordinates (1+4a, 0), (−1−4b, 0), (0, 1+4c), (0, −1−4d), (1+4e, 1+4e), (−1−4f, −1 −4f), (1+4g, −1−4g), and (−1 −4h, 1+4h), and wherein a, b, c, d, e, f, g, and h are natural numbers;

wherein the test patterns of the second alignment pattern area are arranged by using a center of the second alignment pattern area as a coordinate axis (0, 0), and the points of the test patterns of the second alignment pattern area are picked based on the coordinates (2+4i, 0), (−2−4j, 0), (0, 2+4k), (0, −2−4l), (2+4m, 2+4m), (−2−4n, −2−4n), (2+4p, −2−4p), and (−2−4q, 2+4q), and wherein i, j, k, l, m, n, p, and q are natural numbers;

wherein the test patterns of the third alignment pattern area are arranged by using a center of the third alignment pattern area as a coordinate axis (0, 0), and the points of the test patterns of the third alignment pattern area are picked based on the coordinates (3+4r, 0), (−3−4s, 0), (0, 3+4t), (0, −3−4u), (3+4v, 3+4v), (−3−4w, −3−4w), (3+4z, −3−4z), and (−3−4A, 3+4A), and wherein r, s, t, u, v, w, z and A are natural numbers; and wherein the test patterns of the fourth alignment pattern area are arranged by using a center of the fourth alignment pattern area as a coordinate axis (0, 0), and the points of the test patterns of the fourth alignment pattern area are picked based on the coordinates (4+4B, 0), (−4−4C, 0), (0, 4+4D), (0, −4−4E), (4+4F, 4+4F), (−4−4G, −4−4G), (4+4H,−4−4H), and (−4−4I, 4+4I), and wherein B, C, D, E, F, G, H and I are natural numbers.

2. The photomask with photoresist test patterns of claim 1, wherein a=b=c=d=e=f=g=h.

3. The photomask with photoresist test patterns of claim 1, wherein i=j=k=l=m=n=p=q.

4. The photomask with photoresist test patterns of claim 1, wherein r=s=t=u=v=w=z=A.

5. The photomask with photoresist test patterns of claim 1, wherein B=C=D=E=F=G=H=I.

6. The photomask with photoresist test patterns of claim 1, wherein a=b=c=d=e=f=g=h=i=j=k=l=m=n=p=q=r=s=t=u=v=w=z=A=B=C=D=E=F=G=H=I.

7. An inspection method of photoresist test patterns, comprising:

providing a silicon substrate having a photoresist layer formed thereon;

performing a step exposure on the photoresist layer by using a photomask with a layout pattern area and an external pattern area, wherein the external pattern area is located surrounding the layout pattern area, the external pattern area comprising:

first, second, third and fourth alignment pattern areas formed at respective locations of said external pattern area, each of said first, second, third and fourth alignment pattern areas including respective test patterns, wherein said respective test patterns of said first, second, third and fourth alignment pattern areas are distinct each from the other;

wherein the test patterns of the first alignment pattern area are arranged by using a center of the first alignment pattern area as a coordinate axis (0, 0), and the points of the test patterns of the first alignment area are picked based on the coordinates (1+4a, 0), (−1−4b, 0), (0, 1+4c), (0, −1−4d), (1+4e, 1+4e), (−1−4f, −1−4f), (1+4g, −1−4g), and (−1−4h, 1+4h), and wherein a, b, c, d, e, f, g, and h are natural numbers;

wherein the test patterns of the second alignment pattern area are arranged by using a center of the second alignment pattern area as a coordinate axis (0, 0), and the points of the test patterns of the second alignment pattern area are picked based on the coordinates (2+4i, 0), (−2−4j, 0), (0, 2+4k), (0, −2−4l), (2+4m, 2+4m), (−2−4n, −2−4n), (2+4p, −2−4p), and (−2−4q, 2+4q), and wherein i, j, k, l, m, n, p, and q are natural numbers;

wherein the test patterns of the third alignment pattern area are arranged by using a center of the third alignment pattern area as a coordinate axis (0, 0), and the points of the test patterns of the third alignment pattern area are picked based on the coordinates (3+4r, 0), (−3−4s, 0), (0, 3+4t), (0, −3−4u), (3+4v, 3+4v), (−3−4w, −3−4w), (3+4z, −3−4z), and (−3−4A, 3+4A), and wherein r, s, t, u, v, w, z and A are natural numbers; and wherein the test patterns of the fourth alignment pattern area are arranged by using a center of the fourth alignment pattern area as a coordinate axis (0, 0), and the points of the test patterns of the fourth alignment pattern area are picked based on the coordinates (4+4B, 0), (−4−4C, 0), (0, 4+4D), (0, −4−4E), (4+4F, 4+4F), (−4−4G, −4−4G), (4+4H,−4−4H), and (−4−4I, 4+4I), and wherein B, C, D, E, F, G, H and I are natural numbers; and developing the photoresist layer to form a layout pattern and a photoresist test pattern.

8. The inspection method of photoresist test patterns of claim 7, wherein a=b=c=d=e=f=g=h.

9. The inspection method of photoresist test patterns of claim 7, wherein i=j=k=l=m=n=p=q.

10. The inspection method of photoresist test patterns of claim 7, wherein r=s=t=u=v=w=z=A.

11. The inspection method of photoresist test patterns of claim 7, wherein B=C=D=E=F=G=H=I.

12. The inspection method of photoresist test patterns of claim 7, wherein a=b=c=d=e=f=g=h=i=k=l=m=n=p=q=r=s=t=u=v=w=z=A=B=C=D=E=F=G=H=I.

13. The inspection method of photoresist test patterns of claim 7, wherein an optical instrument is used to detect the test patterns to ensure that the photomask is aligned and stacked accurately.

14. The inspection method of photoresist test patterns of claim 12, wherein the test patterns are the star-shaped.

* * * * *